(12) United States Patent
Remla et al.

(10) Patent No.: US 12,334,930 B2
(45) Date of Patent: Jun. 17, 2025

(54) LOW LATENCY PHASE ALIGNMENT FOR PARALLEL DATA PATHS

(71) Applicant: XILINX, INC., San Jose, CA (US)

(72) Inventors: Riyas Noorudeen Remla, Singapore (SG); Showi-Min Shen, San Jose, CA (US)

(73) Assignee: XILINX, INC., San Jose, CA (US)

(*) Notice: Subject to any disclaimer, the term of this patent is extended or adjusted under 35 U.S.C. 154(b) by 279 days.

(21) Appl. No.: 18/128,945

(22) Filed: Mar. 30, 2023

(65) Prior Publication Data

US 2024/0333270 A1 Oct. 3, 2024

(51) Int. Cl.
H03K 5/01 (2006.01)
H03K 5/00 (2006.01)

(52) U.S. Cl.
CPC ..... H03K 5/01 (2013.01); *H03K 2005/00078* (2013.01); *H03K 2005/00286* (2013.01)

(58) Field of Classification Search
CPC ........... H03K 5/01; H03K 2005/00078; H03K 2005/00286
USPC ........................................................ 327/237
See application file for complete search history.

(56) References Cited

U.S. PATENT DOCUMENTS

| | | | | |
|---|---|---|---|---|
| 7,477,078 B2 * | 1/2009 | Poskatcheev | ...... | G01R 31/3016 327/91 |
| 7,508,893 B1 * | 3/2009 | Gan | ........ | G11C 27/02 375/355 |
| 7,571,337 B1 * | 8/2009 | Zhai | ....... | H04L 7/0008 713/400 |
| 9,337,993 B1 * | 5/2016 | Lugthart | ..... | H04L 27/38 |
| 9,369,263 B1 * | 6/2016 | Baecher | ........ | H04B 17/21 |
| 10,241,538 B2 * | 3/2019 | Chang | ....... | G11C 7/222 |
| 10,536,259 B1 * | 1/2020 | Kenyon | ........ | H04L 7/0025 |
| 2004/0125902 A1 * | 7/2004 | Nishimura | ......... | H04L 7/0037 375/371 |
| 2010/0074385 A1 * | 3/2010 | Dally | ....... | H03M 9/00 375/371 |
| 2012/0314825 A1 * | 12/2012 | Dillinger | ......... | H04L 7/033 375/371 |
| 2016/0301518 A1 * | 10/2016 | Ahn | ........ | H04L 25/14 |
| 2018/0239391 A1 * | 8/2018 | Chang | .......... | G11C 7/222 |
| 2024/0333270 A1 * | 10/2024 | Remla | ......... | H03K 5/01 |

* cited by examiner

*Primary Examiner* — Ryan Jager
(74) *Attorney, Agent, or Firm* — Patterson + Sheridan, LLP

(57) ABSTRACT

Receiver circuitry for mitigating effects associated with the phase differences between a capture clock signal and the receipt of a data signal includes first data path circuitry, second data path circuitry, and phase alignment circuitry. The first data path circuitry receives a first data signal based on a capture clock signal. The second data path circuitry receives a second data signal based on the capture clock signal. The phase alignment circuitry adjusts the phase of a first launch clock signal and a second launch clock signal based on a first clock slip signal and a second clock slip signal, respectively. The phase alignment circuitry adjusts a phase of the capture clock signal relative to one of the first and the second launch clock signals based on a first adjustment value associated with the first data path circuitry and a second adjustment value associated with the second data path circuitry.

20 Claims, 12 Drawing Sheets

LOW LATENCY PHASE ALIGNMENT FOR PARALLEL DATA PATHS

TECHNICAL FIELD

Examples of the present disclosure generally relate to aligning the phase of a capture clock signal used by data paths with the phase of launch clock signals.

BACKGROUND

In a communication system, a launch clock signal is used to transmit a data signal and a capture clock signal is used to capture (e.g., obtain or acquire) data within the data signal. To mitigate errors that may occur when capturing data, the capture clock signal is aligned with the launch clock signal. A communication system includes multiple data paths (i.e., circuitries), each associated with a different launch clock signal and capture clock signal. For each data path, the associated capture clock signal is phase aligned with the associated launch clock signal. Accordingly, an independent phase alignment process is performed on each capture clock signal and launch clock signal pair. As the number of data paths increases, the number of launch clock signals and capture clock signals increases, increasing the design complexity and manufacturing cost of the corresponding communication device.

SUMMARY

In one example, receiver circuitry includes first data path circuitry, second data path circuitry, and phase alignment circuitry. The first data path circuitry receives a first data signal based on a capture clock signal. The first data signal is output based on a first launch clock signal. The second data path circuitry receives a second data signal based on the capture clock signal. The second data signal is output based on a second launch clock signal. The phase alignment circuitry adjusts a phase of the first launch clock signal and a phase of the second launch clock signal based on a first clock slip signal and a second clock slip signal, respectively. Further, the phase alignment circuitry adjusts a phase of the capture clock signal relative to one of the first launch clock signal and the second launch clock signal based on a first adjustment value associated with the first data path circuitry and a second adjustment value associated with the second data path circuitry.

In one example phase alignment circuitry adjusts a phase of a first launch clock signal based on a first clock slip signal and a phase of a second launch clock signal based on a second clock slip signal. A first data signal is output based on the first launch clock signal and a second data signal is output based on the second launch clock signal. Further, the phase alignment circuitry adjusts a phase of a capture clock signal relative to one of the first launch clock signal and the second launch clock signal based on a first adjustment value and a second adjustment value. The first adjustment value is associated with a first data path and the second adjustment value is associated with a second data path.

In one example, a method includes adjusting a phase of a first launch clock signal based on a first clock slip signal and a phase of a second launch clock signal based on a second clock slip signal. A first data signal is output based on the first launch clock signal and a second data signal is output based on the second launch clock signal. Further, the method includes adjusting a phase of a capture clock signal relative to one of the first launch clock signal and a second clock signal based on a first adjustment value and a second adjustment value. The first adjustment value is associated with a first data path and the second adjustment value is associated with a second data path.

BRIEF DESCRIPTION OF DRAWINGS

So that the manner in which the above-recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
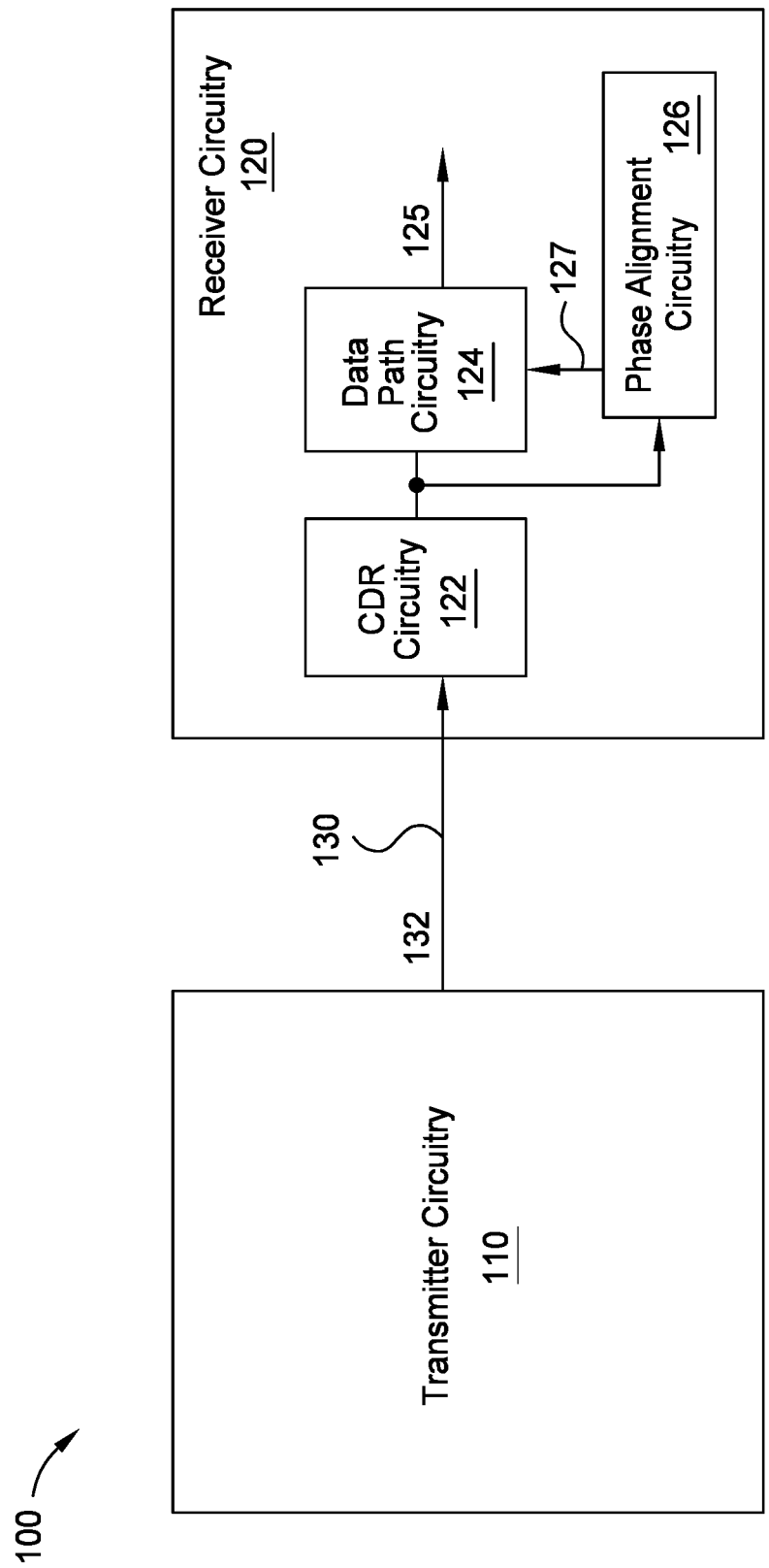
FIG. 1 is a block diagram of a communication system.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the features or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Data signals are communicated between transmitter circuitry and receiver circuitry of a communication system. In such a communication system, multiple data paths are used to communicate the data. Each data path is associated with a different propagation time, or delay. Accordingly, the transmitted data is available to the receiver circuitry at different times. The data signals are transmitted based on a first clock signal (e.g., a launch clock signal) and received, or captured, based on a second clock signal (e.g., a capture clock signal).

The second clock signal may be adjusted to account for the propagation time of the corresponding data path. However, as the propagation time of each data path is different, and the launch clock and capture clock are shared by multiple data paths, the capture clock signal adjusted for one data path may cause errors with the received data associated with another data path.

In the following, an improved phase alignment system and method are described to mitigate alignment issues between the phase of a launch clock signal and the phase of a capture clock signal. The phase alignment system and method describe here take into account the propagation time of each data path to determine the adjustment applied to a capture clock signal to mitigate phase alignment errors between the capture clock signal and launch clock signal. In the communication system described herein, a launch clock signal and capture clock signal are used by multiple data paths. Beacon path circuitry is used to determine an adjustment value for each data path circuitry independently from each other. Each of the adjustment values is then used to determine an alignment value that is used to shift the phase of the capture clock signal relative to the launch clock signal, such that the capture clock signal is adjusted based on each of the adjustment values. Sharing a launch clock signal and a capture clock signal among multiple data path circuitries, reduces the number of launch clock signals and capture clock signals within the communication system, reducing the clock signal resources, and reducing the design complexity. Further, reducing the clock signal resources to simplify the corresponding circuit design, reduces the corresponding semiconductor manufacturing costs.

FIG. 1 illustrates a block diagram of a communication system 100, according to one or more examples. The communication system 100 includes transmitter circuitry 110 and receiver circuitry 120 communicatively connected to each other via channel 130. In one example, the transmitter circuitry 110 is part of a transceiver device and/or the receiver circuitry 120 is part of a transceiver device. In one example, the communication system 100 is a serial communication system. Further, in one or more examples, the transmitter circuitry 110 and the receiver circuitry 120 are each part of a serializer-deserializer (SerDes). The communication system 100 is included within one or more integrated circuit (IC) devices. For example, the transmitter circuitry 110 is included within a first IC device and the receiver circuitry 120 is included in a second IC device. In another example, at least a portion of the transmitter circuitry 110 and at least a portion of the receiver circuitry 120 is included within a common IC device. In one example, an IC device may be a field programmable gate array (FPGA), or an application specific IC (ASIC), among others.

The transmitter circuitry 110 communicates (e.g., transmits) a data signal 132 to the receiver circuitry 120 via the channel 130. The data signal 132 may be a serial data signal. The data signal 132 includes one or more symbols. The transmitter circuitry 110 converts each symbol into a voltage which is driven onto the channel 130 and received by the receiver circuitry 120. The transmitter circuitry 110 uses one or more modulation schemes (e.g., a binary non-return-to-zero modulation scheme or a multi-level digital baseband modulation scheme, among others). Further, the transmitter circuitry 110 drives the data signal 132 based on a transmitter clock signal. The transmitter clock signal may be generated locally within the transmitter by clock generation circuitry (e.g., phase-locked loop (PLL) circuitry).

The receiver circuitry 120 receives the data signal 132 from the transmitter circuitry 110 via the channel 130. In one or more examples, the receiver circuitry 120 includes clock and data recovery (CDR) circuitry 122 that generates a clock signal that is based on the transmitter rate of the data signal 132, and accordingly, the clock signal of the transmitter circuitry 110. In one or more examples, the CDR circuitry 122 adjusts the phase of the clock signal based on the data signal 132. In one example, the CDR circuitry 122 is part of equalization circuitry that mitigates inter-symbol interference (ISI) via an equalization process. The equalization process includes restoring the amplitude distortions that occur within the data signal transmitted by the transmitter circuitry 110 via the channel 130. In one example, the clock signal generated by the CDR circuitry 122 may be referred to as a launch clock signal.

The receiver circuitry 120 further includes data path circuitry 124 that decodes and processes the data signal 132 based on the launch clock signal. Additionally, or alternatively, the data path circuitry 124 functions as a pass through, passing the data signal 132 in a substantially unmodified state. The data path circuitry 124 includes one or more data path circuitries. In one example, the data path circuitry 124 includes one or more data path circuitries. The data path circuitries may be in parallel with each other.

The receiver circuitry 120 further includes phase alignment circuitry 126 that receives the clock signal from the CDR circuitry 122 and generates a receive clock signal (e.g., capture clock signal) 127. In one example, the phase alignment circuitry 126 generates the receive clock signal 127 based on a delay within the data path circuitry 124. In an example, where the data path circuitry 124 includes two or more data paths, the phase alignment circuitry 126 generates the receive clock signal 127 based on the delay of each of the two or more data path circuitries. The receive clock signal 127 is in a different clock domain from that of the signal output by the CDR circuitry 122.

The data path circuitry 124 outputs data signal 125 based on the output of the data signal output by the CDR circuitry 122 and the adjusted receive clock signal 127 generated by the phase alignment circuitry 126.

In one example, a beacon signal associated with each data path of the data path circuitry 124 is used for phase alignment. Adjustment data for each data path is generated based on the beacon signal associated of each data path and a delay associated with each data path circuitry. Further, the phase alignment circuitry 126 adjusts the phase of the receive clock signal based on adjustment data of each data path circuitry. In one example, the adjustment data of each data path is averaged (or combined in some other way) to determine an alignment value that is used to adjust the phase of the receive clock signal.

Figure 2:
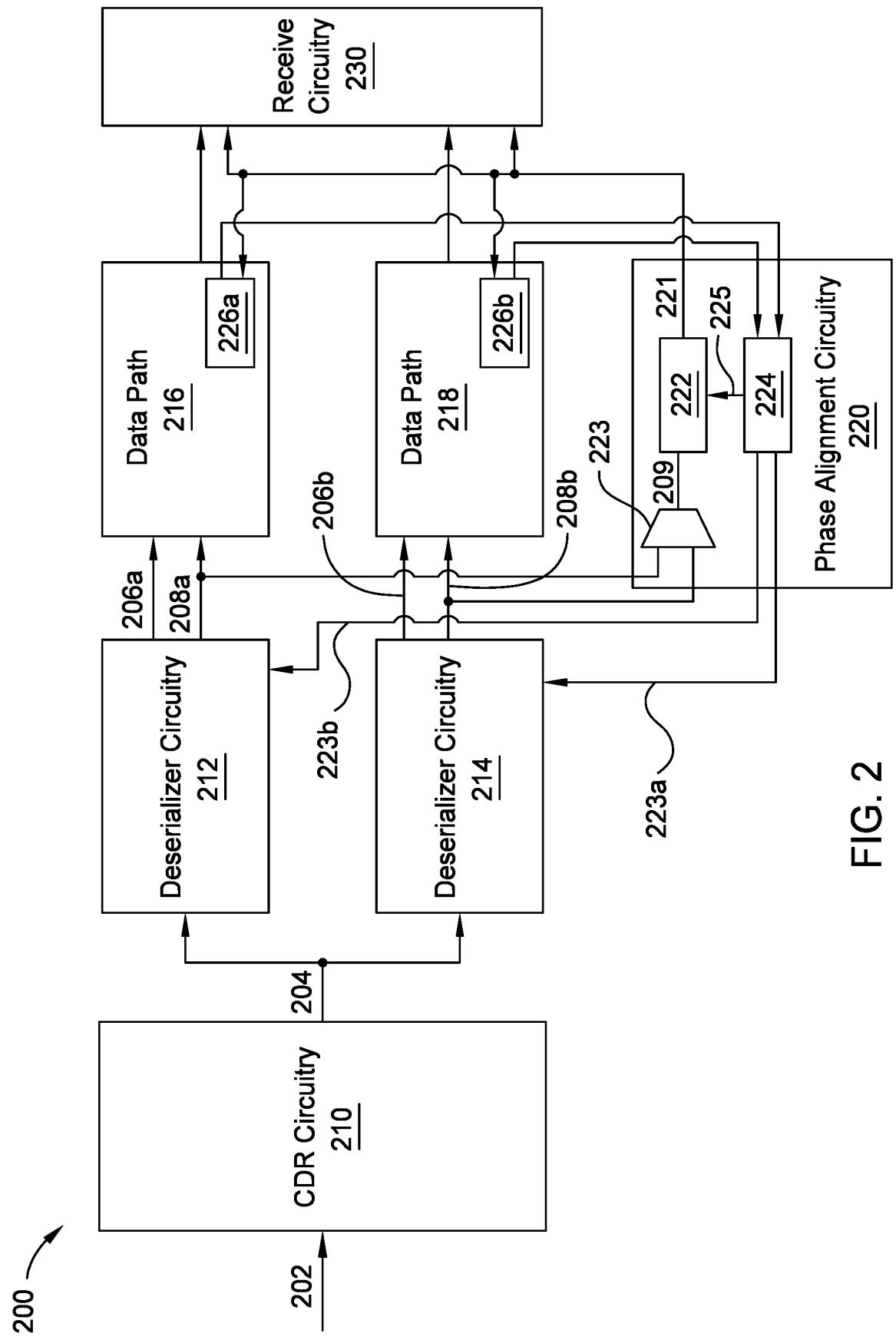
FIG. 2 is a block diagram of receiver circuitry.

FIG. 2 illustrates a block diagram of receiver circuitry 200, according to one or more examples. The receiver circuitry 200 is configured similar to the receiver circuitry 120 of FIG. 1. The receiver circuitry 200 includes CDR circuitry 210, deserializer circuitry 212 and 214, data paths 216 and 218, phase alignment circuitry 220. In one example, the data path 216 is associated with a raw data path and the data path 218 is associated media access control (MAC) data path. In the raw data path, the data flowing through the data path is unprocessed. A MAC data path includes one or more of synchronizer circuitry, decoder circuitry, and/or de-scrambler circuitry, among others. In one or more examples, the data path 216 is 16 bits and the data path 218 is 8 bits.

The CDR circuitry 210 functions similarly as described above with regard to the CDR circuitry 122 to receive the signal 202 and generate the signals 204. The deserializer circuitry 212 receives the signal 204 and generates the data signal 206a and the clock signal 208a. In one example, the signal 204 is a parallel data signal, and the deserializer circuitry 212 converts the parallel data signal 204 to the serial data signal 206a, and generates the clock signal 208a from the signal 204. Further, the deserializer circuitry 214 converts the parallel data signal 204 to the serial data signal 206b, and generates the clock signal 208b from the signal 204. In one example, the clock signal 208a and the clock signal 208b are the same (e.g., have the same frequency, phase, and amplitude). The clock signals 208a and 208b may be referred to as launch clock signals.

The clock signals 208a and 208b are used as the clock signal for the interface circuitry of the data paths 216 and 218, respectively.

The phase alignment circuitry 220 receives one of the clock signals 208a and 208b (e.g., a selected clock signal 209), and generates the capture clock signal 221. In one example, the clock signals 208a and 208b are received by selection circuitry 223, which selects one of the clock signals 208a and 208b to output to the phase interpolator circuitry 222 as the selected clock signal 209. The selection circuitry 223 may be a multiplexer, or another type of selection circuitry. In one example, the phase alignment circuitry 220 adjusts the phase of the selected clock signal 209 based on the delay of the data path circuitries 216 and 218 as described above with regard to the phase alignment circuitry 126 to generate the capture clock signal 221. Further, the phase alignment circuitry 220 adjusts the phase of the selected clock signal 209 based on adjustment data of each data path to generate the capture clock signal 221. In one example, the adjustment data of each data path is averaged (or combined in some other way) to adjust the phase of the selected clock signal 209 to generate the capture clock signal 221. The phase capture clock signal 221 is aligned with that of the selected clock signal 209, and shifted by 180 degrees. In one example, the phase of the capture clock signal 221 is adjusted to improve the timing margin for each of the data path circuitries 216 and 218. In one example, the clock domain associated with the clock signals 208a and 208b differs from the clock domain associated with the capture clock signal 221.

In one example, the phase alignment circuitry 220 includes phase interpolator circuitry 222 which is adjusted to adjust the phase of the capture clock signal 221. In one example, the phase interpolator circuitry 222 is adjusted based on a code value. The code value may be a range of values from 0 to 255. In other examples, other code value ranges may be used (e.g., 64 code values, 128 code values, or 512 code values, among others. Each code value is associated with an amount of phase shift. For example for a code range of 0 to 255, a code value of 0 is associated with a 0 degree phase shift and a code value of 255 is associated with a 360 degree phase shift. The code values between 0 and 255 correspond to phase shifts between 0 and 360 degrees.

The phase alignment circuitry 220 further includes phase alignment control circuitry 224. The phase alignment control circuitry 224 determines the amount to adjust the phase of the phase interpolator circuitry 222 based on the selected clock signals 209, and the delays associated with the data path circuitries 216 and 218. In one example, the phase alignment control circuitry 224 provides the alignment signal 225 to the phase interpolator circuitry 222 to rotate the phase of the phase interpolator circuitry 222 and the phase of the capture clock signal 221. In one example, the phase alignment control circuitry 224 adjusts (e.g., controls) the deserializer circuitries 212 and 214 to adjust the phase of the clock signals 208a and 208b via the clock slip signals 223a and 223b. The clock slip signal 223a and 223b are used slip the deserializer circuitries 212 and 214 in terms of 2UI or 4UI resolutions per slip. A UI is the 1/data_rate of the corresponding data path.

Further, the phase alignment circuitry 220 is connected to the beacon path circuitry 226a and 226b. The beacon path circuitry 226a may be included within the data path 216, and the beacon path circuitry 226b may be included within the data path 218. As is described in greater detail in the following, the beacon path circuitry 226a uses beacon signals associated with the data path 216 to determine a phase adjustment value that aligns the phase of the capture clock signal 221 with that of the selected clock signal 209. Further, the beacon path circuitry 226b uses beacon signals associated with the data path 218 to determine a phase adjustment value that aligns the phase of the capture clock signal 221 with that of the selected clock signal 209. The phase adjustment values are used by the phase alignment control circuitry 224 to determine the amount to adjust the phase of the phase interpolator circuitry 222. In one example, the adjustment values are averaged (or combined in some other way) to determine the alignment value used to adjust the phase interpolator circuitry 222.

The capture clock signal 221 is received by receive circuitry 230, and is used to capture data within the parallel data signals 206a and 206b. Accordingly, each the clock signal 221 is used to capture (e.g., acquire) data from each of the parallel data signal 206a and 206b.

In one example, a data path associated with the deserializer circuitry 212 and the data path circuitry 216 has a first data width and a data path associated with the deserializer circuitry 214 and the data path circuitry 218 has a second data width. The first data width and the second data width may be the same. In another example, the first data width is greater than or less than the second data width.

Figure 3:
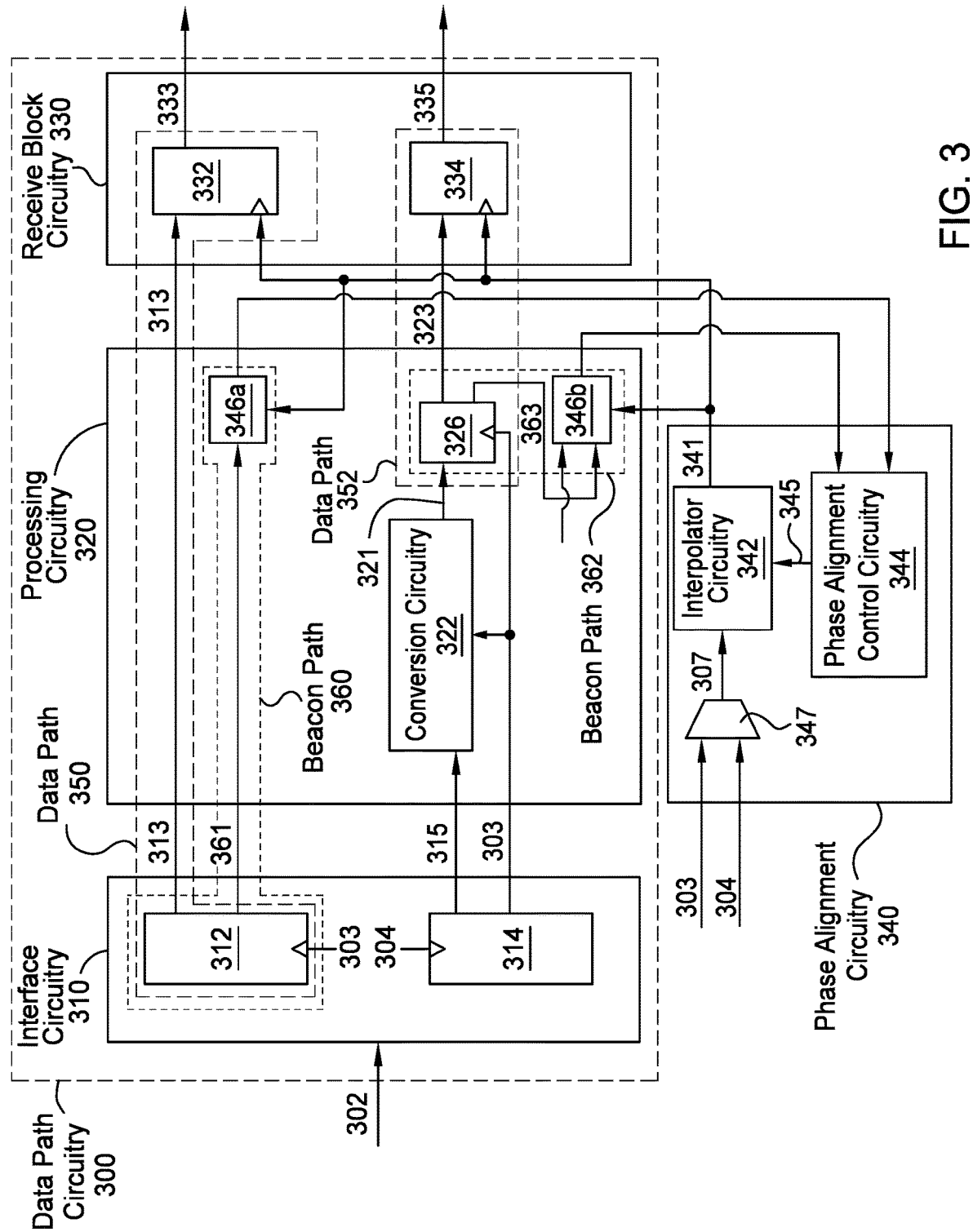
FIG. 3 is a block diagram of receiver circuitry.

FIG. 3 illustrates a block diagram of data path circuitry 300, according to one or more examples. The data path circuitry 300 includes interface circuitry 310, processing circuitry 320, and receive block circuitry 330. The data path circuitry 300 receives the data signal 302 and receives the capture clock signal 341 from the phase alignment circuitry 340. The signal 302 may be received from CDR circuitry (e.g., CDR circuitry 210 of FIG. 2) or deserializer circuitry (e.g., deserializer circuitry 212 and/or 214).

The data path circuitry 300 includes data paths 350 and 352. In other examples, the data path circuitry 300 may have more than two data paths. The data path 350 is from the flip-flop 312 of interface circuitry 310 to the flip-flop 332 of the receive block circuitry 330 via the processing circuitry 320. The data path 352 is from the flip-flop 326 to the flip-flop 334 of the receive block circuitry 330. The data path 350 may be referred to as a raw data path as the signal 313 is not substantially modified by the processing circuitry 320.

In one example, the processing circuitry 320 may be MAC circuitry. For example, the processing circuitry 320 includes synchronizer circuitry, decoder circuitry, and/or de-scrambler circuitry, among others. In other examples, the processing circuitry 320 includes other types of signal processing circuitry.

In one example, the flip-flop 312 generates and outputs the signal 313 from the signal 302 based on the launch clock signal 303. The signal 313 is received by the flip-flop 332 in a substantially unmodified state. The flip-flop 314 generates and outputs the signal 315 from the signal 302 based on the launch clock signal 304. The clock signal 303 and 304 differ in frequency. For example, the frequency of the clock signal 304 is greater than that of the clock signal 303. While the flip-flops 312 and 314 are illustrated in FIG. 3, in other examples, additional, or alternative, circuit elements may be used to output the signals 313 and 315.

The signal 315 is received by the conversion circuitry 322, which generates the signal 323. In one example, the conversion circuitry 322 converts the signal 315 from a first data bit width to a second data bit width. For example, the signal 315 is converted from an 8 bit signal to a 16 bit signal. The flip-flop 326 receives the signal 321 and outputs the signal 323. In one or more examples, the data width of each data path 350 and 352 is the same.

In one example, the data path circuitry 300 includes a beacon path 360 and a beacon path 362. The beacon path 360 is associated with the data path 350 and includes beacon path circuitry 346a. The beacon path circuitry 346a receives a beacon signal 361 from the flip-flop 312. In another example, the beacon signal 361 is received from another circuit element. In one example, the beacon path circuitry 346a determines a phase adjustment value for the data path 350 based on the beacon signal 361 and data path delay. Further, the beacon signal 361 is clock divided by two.

The beacon path 362 includes beacon path circuitry 346b that receives a beacon signal 363 from the flip-flop 326. In another example, the beacon signal 363 is received from another circuit element. In one example, the beacon path circuitry 346b determines a phase adjustment value for the data path 352 based on the beacon signal 363 and data path delay. Further, the beacon signal 363 is clock divided by two.

The beacon signals 361 is generated based on the clock signal 303, and the beacon signal 363 is generated based on the clock signal 304, and captured using the capture clock signal 341. Further, the beacon signals 361 and 363 may be one bit each. In other example, the beacon signals 361 and 363 are greater than one bit.

The data path circuitry 350 has a first delay (e.g., a first propagation time) and the data path circuitry 352 has a second delay (e.g., a second propagation time) different than the first delay. Further, the data paths 350 and 352 both receive the capture clock signal 341, and acquire (e.g., captures) the signals 313 and 323 based on the capture clock signal 341. The launch clock signal 303 and the capture clock signal 341 have the same frequency. However, the phase relationship between the launch clock signal 303 and 341 is unknown. In one example, the phase of the launch clock signal 303 is adjusted by the phase alignment circuitry 340 to generate the capture clock signal 341 with a specified phase relationship with the selected clock signal 307. For example, the phase of the capture clock signal 341 is aligned with that of the selected clock signal 307, and then shifted by 180 degrees (or another known amount).

The phase alignment circuitry 340 includes phase interpolator circuitry 342, phase alignment control circuitry 344, and selection circuitry 347. The phase interpolator circuitry 342 receives the selected clock signal 307 and alignment value 345 from the phase alignment control circuitry 344. In one example, the selected clock signal 307 is selected by the selection circuitry 347 from the clock signal 303 and the clock signal 304. The alignment value 345 includes an indication as to how to adjust the phase of capture clock signal 341. For example, the alignment value 345 corresponds to a code value that is used by the phase interpolator circuitry 342 to adjust the phase of the capture clock signal 341 relative to the selected clock signal 307. In one example, the phase alignment circuitry 340 selects a beacon path associated with the data path 350 or the data path 352 to use during phase alignment.

The phase alignment control circuitry 344 receives each of the phase adjustment values determined by the beacon path circuitries 346a and 346b and determines the alignment value 345. In one example, the phase alignment control circuitry 344 averages (or combines in some other way) the adjustment values determined for each of the data paths to generate the alignment value 345.

In on example, the capture clock signal 341 is adjusted such that a rising edge of the capture clock signal 341 is aligned with a rising edge of the selected clock signal 307. The phase of the capture clock signal 341 is then adjusted by 180 degrees, such that the capture clock signal 341 is 180 degrees out of phase with the selected clock signal 307. In one example, a 180 degree adjustment is used to mitigate the impact of duty cycle distortion (DCD) when a negative edge is used. In other examples, other amounts of phase adjustment may be used.

The flip-flop 332 receives the signal 313 and outputs the signal 333 based on the capture clock signal 341. Further, the flip-flop 334 receives the signal 323 and outputs the signal 335 based on the capture clock signal 341.

Figure 4:
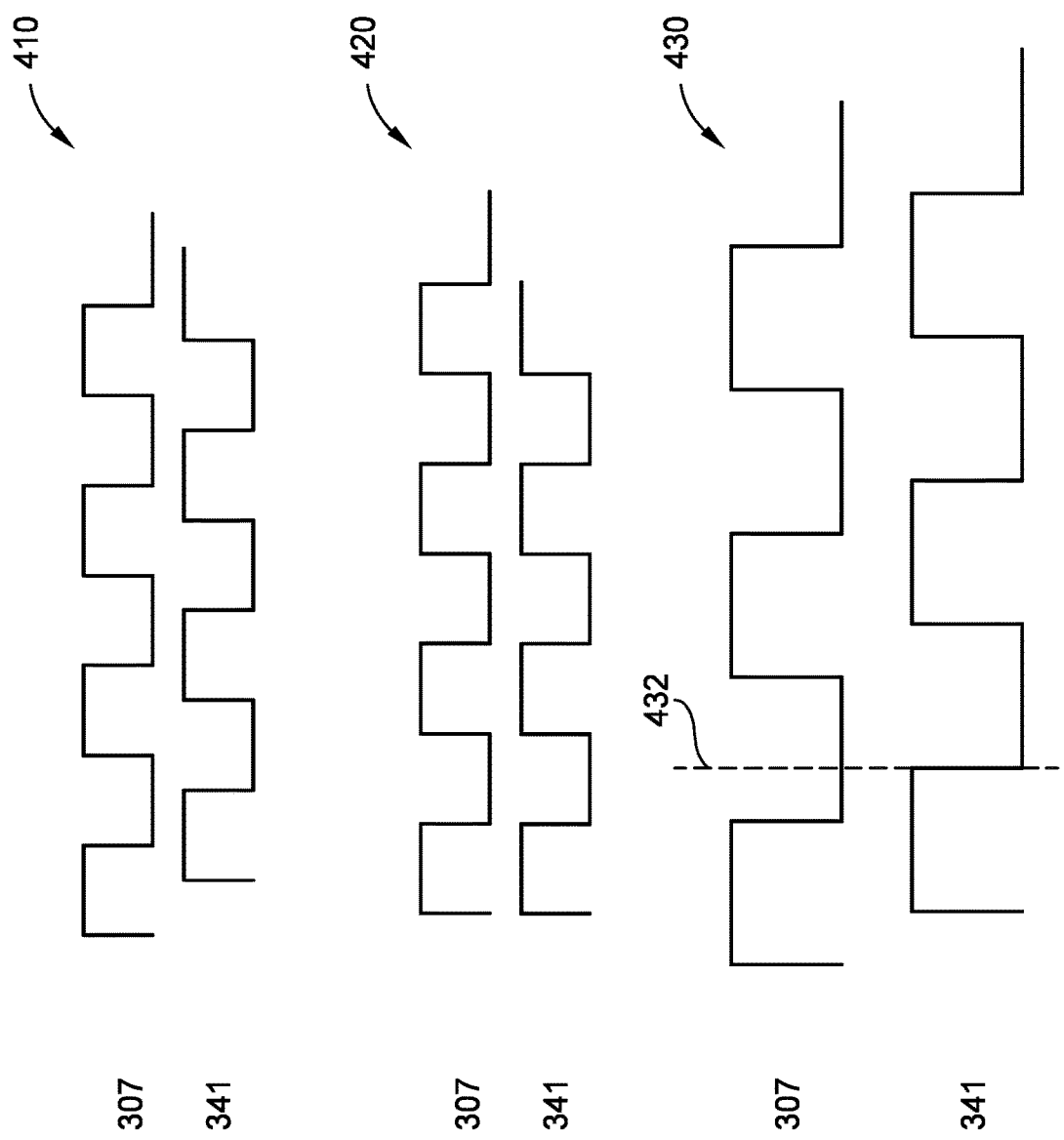
FIG. 4 illustrates waveforms of various instances of a launch clock signal and a capture clock signal.

FIG. 4 illustrates various instances of the selected clock signal 307 and the capture clock signal 341. In instance 410, the selected clock signal 307 and the capture clock signal 341 are out of phase with each other. In instance 420, the selected clock signal 307 and the capture clock signal 341 are phase aligned with each other such that the rising and falling edges of the selected clock signal 307 and the capture clock signal 341 are aligned. In instance 430, a negative edge (e.g., falling edge) of the capture clock signal 341 is aligned with data arrival time (or period) 432. The data arrival time 432 is associated with when a data signal is received by the target circuit element. For example with regard to FIG. 3, the data arrival time 432 corresponds to when the data signal 313 is received by the flip-flop 332 or the data signal 323 is received by the flip-flop 334. In one example, the data arrival time is passed to the phase alignment control circuitry 344 via the beacon path circuitry 346. Further, the beacon path is delayed matched with the data path via the beacon path circuitry 346. In one example, after delay matching for a one bit beacon signal with n-bit data path, the phase alignment control circuitry 344 use the one bit beacon signal to adjust the capture clock signal. In one example, the data arrival time is aligned to a rising edge of the capture clock signal 341, and shifted by 180 degrees to mitigate DCD from the timing.

Figure 5:
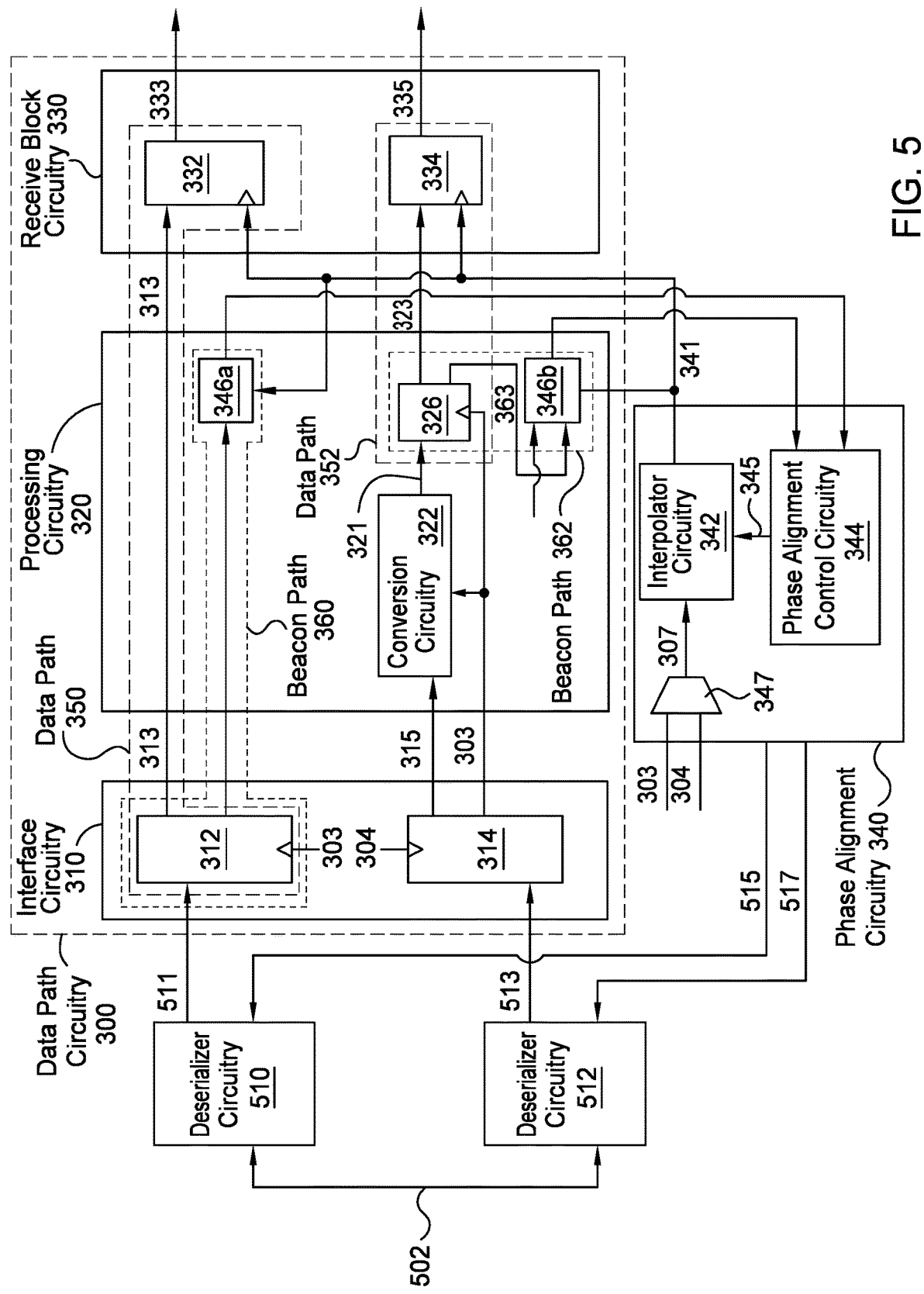
FIG. 5 is a block diagram of receiver circuitry.

In the example of FIG. 5, the data path circuitry 300 is connected to deserializer circuitries 510 and 512. The deserializer circuitries 510 and 512 may be 16 bit deserializer circuitries. In other examples, the deserializer circuitries 510 and 512 may be less than or greater than 16 bits. The deserializer circuitry 510 receives the signal 502 and outputs the signal 511, and the deserializer circuitry 512 receives the signal 502 and outputs the signal 513. The signal 502 is received from a CDR circuitry (e.g., the CDR circuitry 122 of FIG. 1 or 210 of FIG. 2). The deserializer circuitries 510 and 512 are configured similar to that of the deserializer circuitries 212 and 214 of FIG. 2.

The phase alignment circuitry 340 is configured to adjust the deserializer circuitries 510 and 512 via the adjustment signals 515 and 517 to adjust phase of the capture clock signal 341 relative to the launch clock signals 303 and 304. In one example, the deserializer circuitries 510 and 512 perform clock signal adjustment (e.g., clock slipping) simultaneously, or during an at least partially overlapping periods, based on the adjustment signals 515 and 517. In one example, as will be described in greater detail in the following, the adjustment signals 515 and 517 are generated based on the beacon signals and delays for each data path 350 and 352. The phase alignment circuitry 340 further adjusts the phase of the capture clock signal 341 relative to the phase of the launch clock signals 303 and 304 by adjusting the phase interpolator circuitry 342 as is described above. In one example, using the adjustment signals 515 and 517 to adjust the phase of the capture clock signal 341 relative to the launch clock signals 303 and 304 may be referred to as a coarse phase adjustment, and adjusting the phase interpolator circuitry 342 to adjust the phase of the capture clock signal 341 relative to the phase of the selected clock signal 307 may be referred to as fine phase adjustment.

Figure 6:
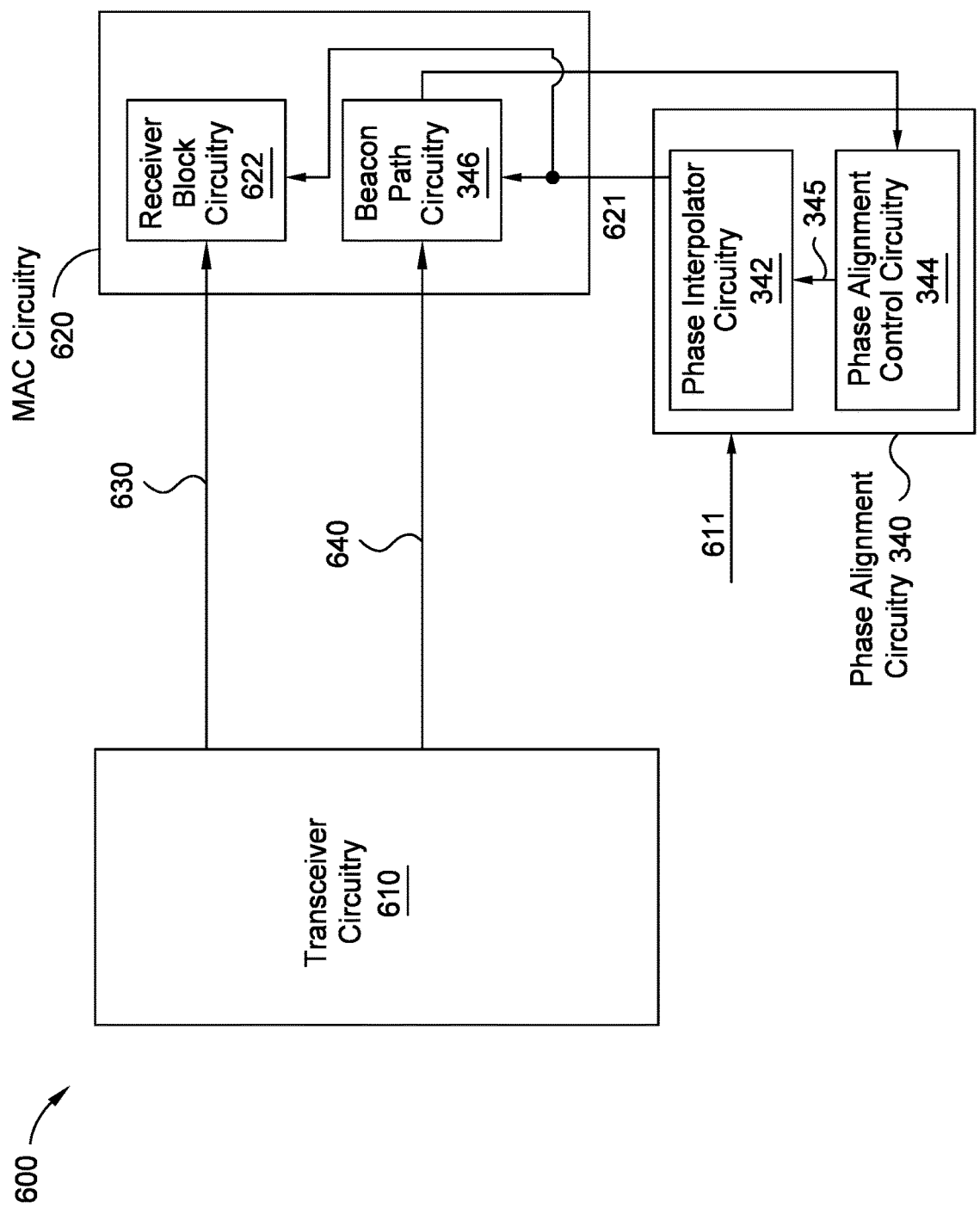
FIG. 6 is a block diagram of a communication system.

FIG. 6 illustrates a block diagram of a communication system 600, according to one or more examples. The communication system 600 includes transceiver circuitry 610 and MAC circuitry 620. The transceiver circuitry 610 is connected to the MAC circuitry 620 via data path 630 and beacon path 640. The data path 630 has a bit width of M bits, where M is at least two bits. A beacon signal (or signals) is transmitted via the beacon path 640 from the transceiver circuitry 610 to the MAC circuitry 620. The beacon signals are one or more bits. In one example, the width of the beacon path 640 is one bit. Further, data is transmitted via the data path 630 from the transceiver circuitry 610 to the MAC circuitry 620.

The MAC circuitry 620 includes receiver block circuitry 622 and beacon path circuitry 346. The receive block circuitry 622 includes one or more flip-flops and other circuit elements that receive a signal via the data path 630 based the capture clock signal 621.

The beacon path circuitry 346 receives a beacon signal via the beacon path 640, and generates an adjustment value that is used by the phase alignment circuitry 340 to align the phase of the capture clock signal 621 with the phase of the clock signal 611 (e.g., the launch clock signal).

The phase alignment circuitry 340 adjusts the phase of a capture clock signal 621 relative to the capture clock signal 621. The phase alignment circuitry 340 functions as described above to adjust the capture clock signal 621 used by the MAC circuitry 620 to be aligned with the clock signal 611 to capture (e.g., obtain) data within a data signal transmitted via the data path 630.

Figure 7:
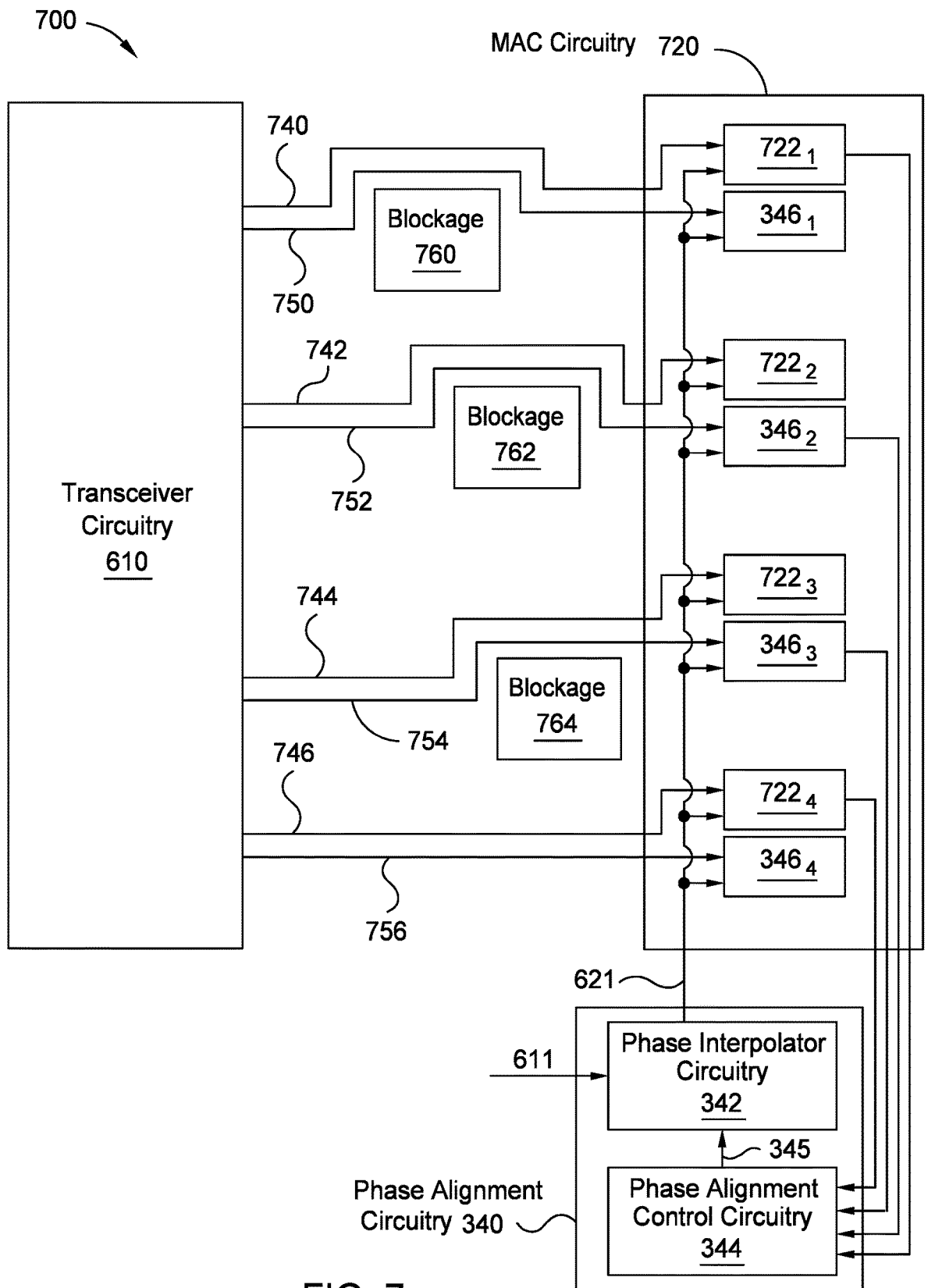
FIG. 7 is a block diagram of a communication system including blockages and multiple data path segments and corresponding beacon paths.

FIG. 7 illustrates a block diagram of a communication system 700, according to one or more examples. FIG. 7 illustrates a single data path that is split into multiple data path segments (e.g., data path segments 740, 742, 744, and 746) with corresponding beacon paths (e.g., beacon paths 750, 752, 754, and 756). The communication system 700 is configured similar to the communication system 600 of FIG. 6. For example, the communication system 700 includes the transceiver circuitry 610, the MAC circuitry 720, and the phase alignment circuitry 340. The communication system 700 includes the data path segments 740, 742, 744, and 746, and the beacon path 750, 752, 754, and 756. As compared to the data path 630 and beacon path 640 of FIG. 6, one or more of the data path segments 740, 742, 744, and 746 and/or one or more of the beacon path 750, 752, 754, and 756 is routed around a corresponding blockage (e.g., blockages 760, 762, 764). The blockages 760, 762, and 764 may be circuit elements, vias, and/or other routings that block the routing of the traces of the data path segments 740, 742, 744, and 746 and the beacon path 750, 752, 754, and 756.

As is illustrated in FIG. 7, the routing of each of the data path segments 740, 742, 744, and 746 differs from the other. Accordingly, the delay (e.g., propagation time) of each data path segments 740, 742, 744, and 746 is different from the delay of each other data path circuitry. A beacon path 750, 752, 754, and 756 is routed along with each data path segment 740, 742, 744, and 746. A beacon signal is transmitted along each beacon path 750, 752, 754, and 756 and used by the corresponding beacon path circuitry 346 to generate an adjustment value that is used by the phase alignment circuitry 340 to adjust the phase capture clock signal 621 relative to the clock signal 611

Each data path 740-746 is connected to a corresponding receiver circuitry 722 (e.g., 722$_1$-772$_4$), which function as described above with regard to the receiver block circuitry 622. Further, each beacon path 750-756 is connected to a respective beacon path circuitry 346 (e.g., 346$_1$-346$_4$). Each beacon path circuitry 346$_1$-346$_4$ receives a beacon signal from the respective beacon path, and generates an adjustment value based on the delay of the corresponding data path 740-746 and as is described with regard to FIG. 8 and FIG. 10. The phase alignment control circuitry 344 uses the adjustment values generated by each beacon path circuitry 346$_1$-346$_4$ to determine the alignment value 345, which is used by the phase interpolator circuitry 342 to adjust the phase of the capture clock signal 621. In one example, the phase alignment control circuitry 344 averages (or combines in some other way) the adjustment values to determine the alignment value 345. The alignment value 345 corresponds to a code value that is used to adjust the phase of the phase interpolator circuitry 342, adjusting the phase of the capture clock signal 621 with reference to the clock signal 611.

Figure 8:
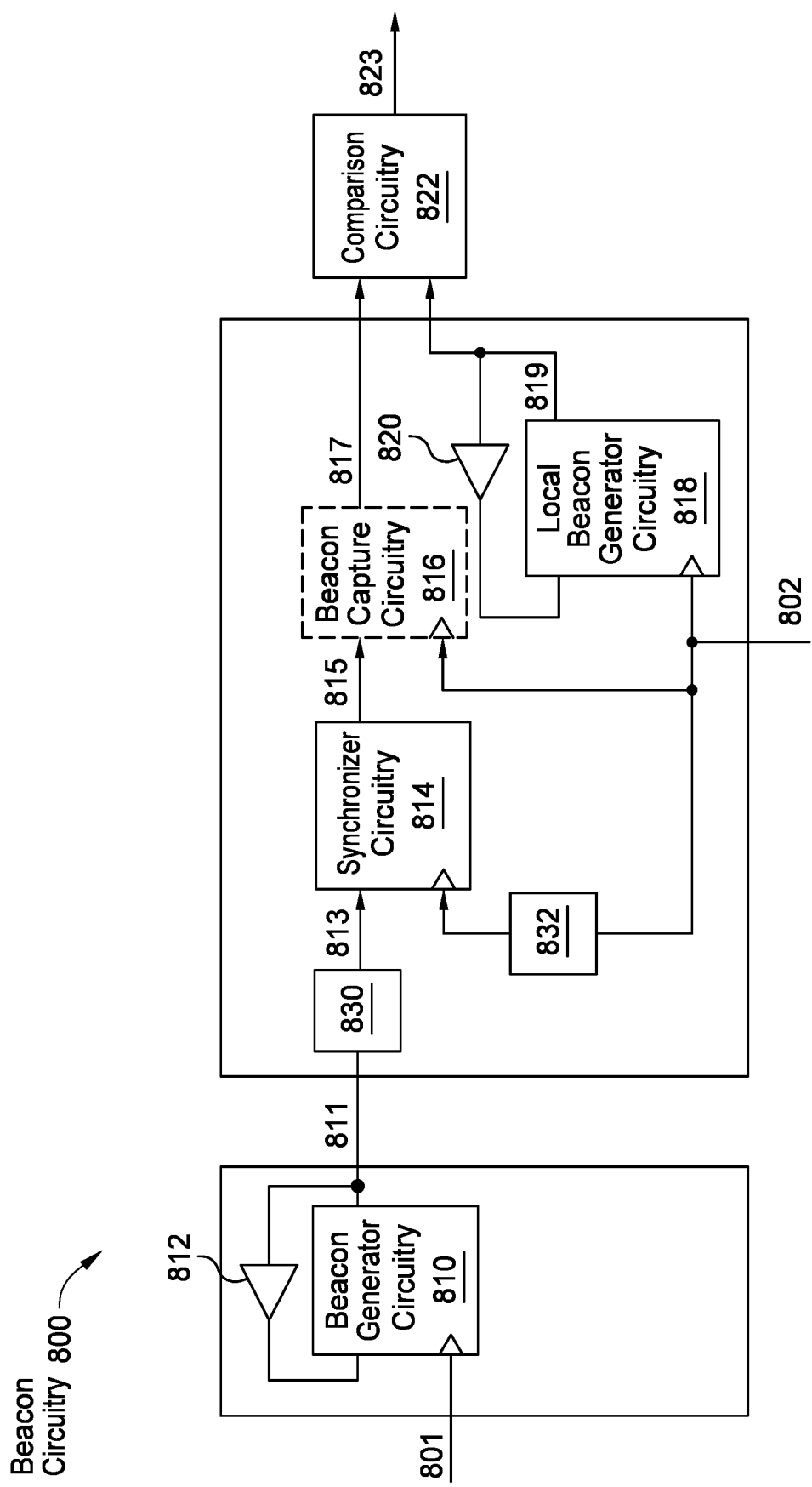
FIG. 8 is a block diagram of beacon path circuitry.

FIG. 8 illustrates a block diagram of beacon path circuitry 800, according to one or more examples. The beacon path circuitry 800 may be used as the beacon path circuitry 346 in FIGS. 2, 3, 5, 6, and 7. The beacon path circuitry 800 includes beacon generator circuitry 810, buffer 812, synchronizer circuitry 814, beacon capture circuitry 816, local beacon generator circuitry 818, buffer 820, and comparison circuitry 822. Further, the beacon path circuitry 800 includes delay circuitries 830 and 832. In one or more examples, the beacon capture circuitry 816 is omitted. In one example, each data path of a communication system (e.g., data path 350 and 352 of FIG. 3) is associated with a beacon path circuitry.

The beacon generator circuitry 810 generates the beacon signal 811 based on the clock signal 801. In one example, the beacon generator circuitry 810 is a flip-flop (e.g., the flip-flop 312 of FIG. 3). The clock signal 801 is a launch clock signal. For example, the clock signal 801 is the launch clock signal 303 or 304 of FIG. 3. Further, the output of the beacon generator circuitry 810 is fed back to the input of the beacon generator circuitry 810 via the buffer 812. Accordingly, the beacon signal 811 is divided by two with respect to the clock signal 801 and rising edge aligned. The buffer 812 may be an inverting buffer.

The beacon signal 811 is delayed via the delay circuitry 830 to generate the delayed signal 813, and then received by the synchronizer circuitry 814. The delayed signal 813 is a delayed beacon signal. The delay circuitry 830 corresponds to the delay of the corresponding data path circuitry. The synchronizer circuitry 814 receives the delayed signal 813 and outputs the signal 815 based on the delayed signal 813 and the clock signal 802. The synchronizer circuitry 814 synchronizes the rising edge of the delayed signal 813 with the rising edge of the clock signal 802. In one example, the clock signal 802 is delayed by the delay circuitry 832 before the clock signal 802 is received by the synchronizer circuitry 814. The delay of the delay circuitry 830 corresponds to the delay of the delay circuitry 832. In one example, delaying the beacon signal 811 based on the delay of the delay circuitry 830 matches the beacon signal 811 to the corresponding data path, and the beacon signal 811 may be used as an approximation of a data signal transmitted via the data path.

The clock signal 802 may be a capture clock signal. For example, the clock signal 802 is the capture clock signal 341 of FIG. 3. The domain of the clock signal 802 differs from the domain of the clock signal 801. In one example, the clock signal 802 and 801 are generated from the same source and there is no parts per million between the clock signals 802 and 801.

The signal 815 is received by the beacon capture circuitry 816. The beacon capture circuitry 816 outputs the signal 817 based on the clock signal 802. The signal 817 is received by the comparison circuitry 822. The signal 817 is a received beacon signal. The local beacon generator circuitry 818 generates the signal (e.g., local beacon signal) 819 based on the clock signal 802. The local beacon signal 819 is fed back to the input of the local beacon generator circuitry 818 via the buffer 820. The buffer 820 may be an inverting buffer. Accordingly, the local beacon signal 819 is divided by two with regard to the clock signal 802 and rising edge aligned. The comparison circuitry 822 receives the local beacon signal 819.

The comparison circuitry 822 compares the signal 817 with the local beacon signal 819 to generate the output signal 823. The output signal 823 is an adjustment value. In one example, the comparison circuitry 822 performs an XOR function on the signals 817 and 819. In such an example, an output signal 823 having a value of 0 corresponds to the signals 817 and 819 being in phase with each other (e.g., phase aligned), and an output signal 823 having a value of 1 corresponds to the signals 817 and 819 not being in phase with other (e.g., phase unaligned). In one example, when alignment starts, the beacon signal 811 may have a value of 0 or 1, with the value being set by a parity bit. An edge (e.g., transition from a value of zero to a value of one or from value of one to a value of zero) is detected. Once the transition is detected, the clock is maintained in that region.

Figure 9:
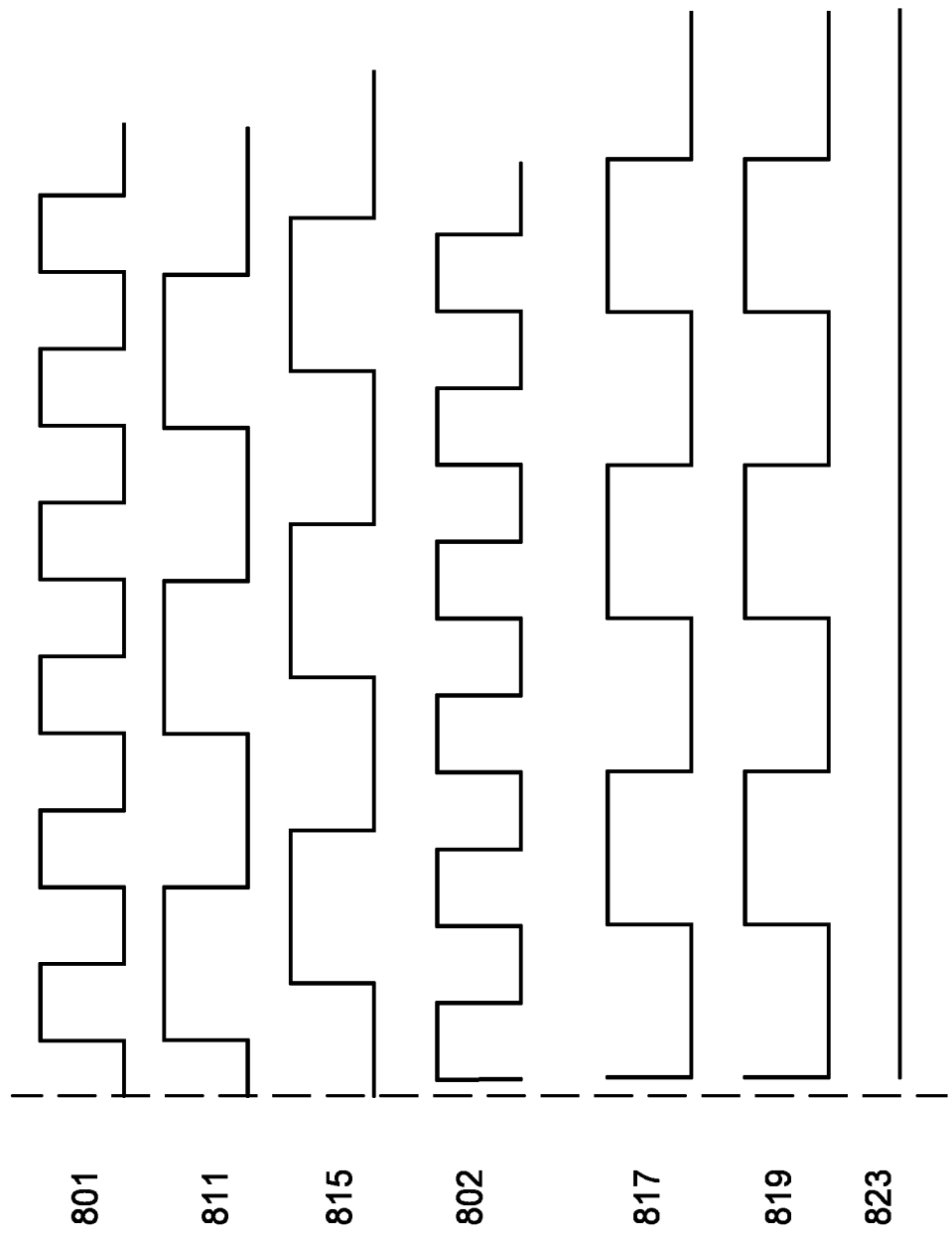
FIG. 9 illustrates waveforms of generated by a beacon path circuitry.

FIG. 9 illustrates waveforms of the clock signal 801, the beacon signal 811, the signal 815, clock signal 802, signal 817, signal 819, and output signal 823. As is illustrated in FIG. 9, the beacon signal 811 is out of phase from the signal 817 as the clock signal 801 is unaligned from the clock signal 802. The signal 817 corresponds to the signal 815 after phase alignment has occurred. Accordingly, the signal 817 is aligned with the local beacon signal 819. As the signal 817 is aligned with the signal 819, the output signal 823 has a value of 0.

Figure 10:
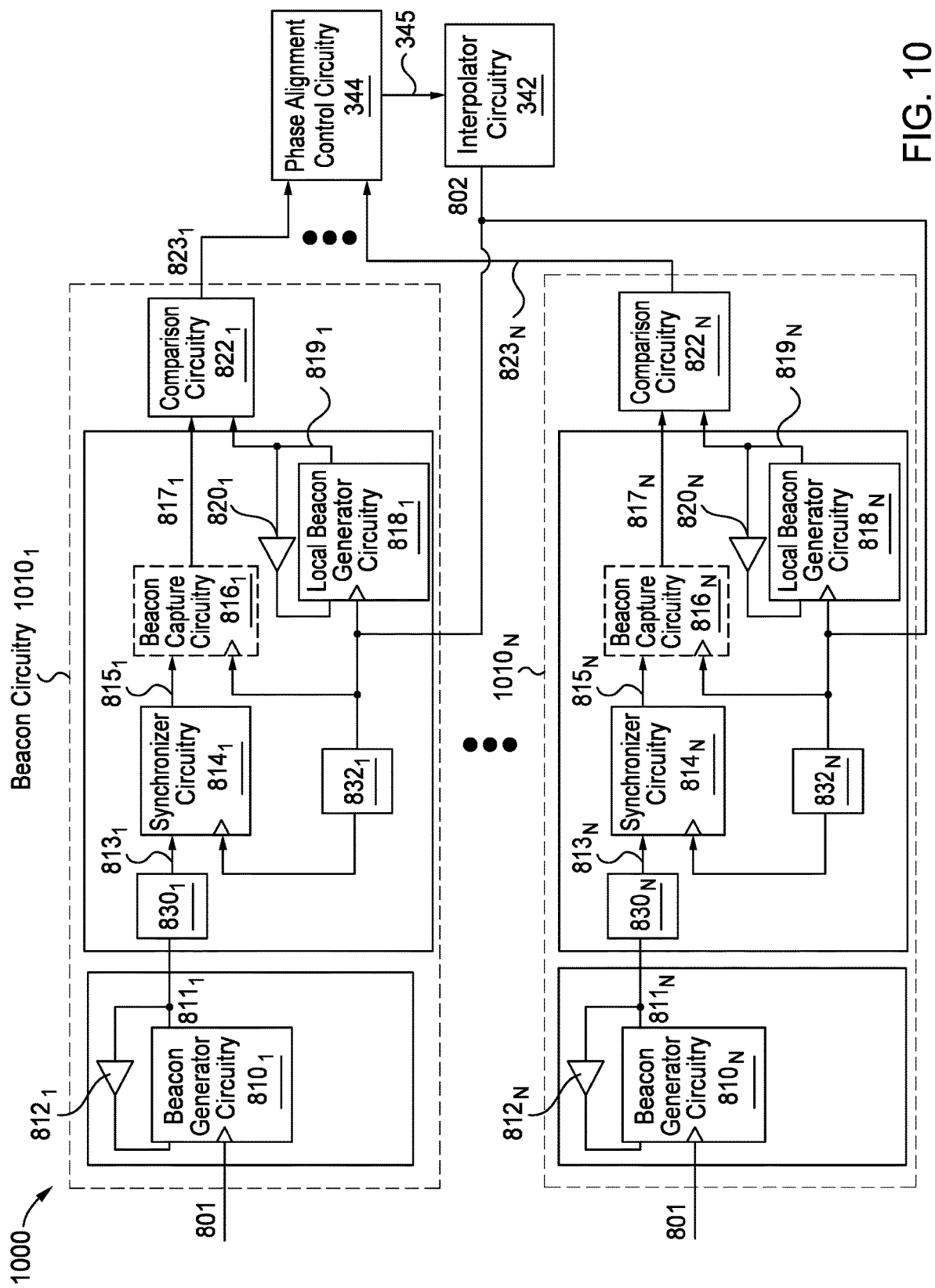
FIG. 10 is a block diagram of multiple beacon path circuitries.

FIG. 10 illustrates a block diagram of beacon path circuitry 1000, according to one or more examples. The beacon path circuitry 1000 includes two beacon circuitries, beacon circuitries $1010_1$-$1010_N$. N is two or more. Each beacon path circuitry 1010 is configured similar to that of the beacon path circuitry 800 of FIG. 1. For example, the beacon path circuitry $1010_1$ includes beacon generator circuitry $810_1$, buffer $812_1$, synchronizer circuitry $814_1$, beacon capture circuitry $816_1$, local beacon generator circuitry $818_1$, buffer $820_1$, comparison circuitry $822_1$, and delay circuitries $830_1$ and $832_1$. The beacon path circuitry $1010_N$ includes beacon generator circuitry $810_N$, buffer $812_N$, synchronizer circuitry $814_N$, beacon capture circuitry $816_N$, local beacon generator circuitry $818_N$, buffer $820_N$, comparison circuitry $822_N$, and delay circuitries $830_N$ and $832_N$. Each of the beacon path circuitries 1010 corresponds to a data path (e.g., the data path 350 or 352 of FIG. 3). In one example, the number of beacon path circuitries 1010 corresponds to the number of data paths.

In one example, one of the beacon path circuitries 1010 operate during a period. For example during a first period, the beacon path circuitry $1010_1$ determines the output signal $823_1$, and during a second period, the beacon path circuitry $1010_N$ determines the output signal $823_N$. The first and second periods are non-overlapping. In one example, switching circuitry controls which of the beacon path circuitries 1010 receives the clock signal 802, controlling which beacon path circuitry 1010 is operating. During each period, the clock signal 802 is provided to one of the beacon path circuitries 1010. Further, the clock signal 802 is output from the phase interpolator circuitry 342.

Each of the beacon path circuitries 1010 output a corresponding output signal 823. The phase alignment control circuitry 344 receives the output signals 823 and determines the alignment value 345. The phase alignment control circuitry 344 receives an output signal 823 from a corresponding beacon path circuitry 1010 during a corresponding period. The output signals 823 are received from the beacon path circuitries 1010 on a one at a time basis. In one example, the phase alignment control circuitry 344 determines a code value for each output signal 823. The phase alignment control circuitry 344 uses an arithmetic average to average the code values to generate the alignment value 345. In another example, the code values are combined in another way (e.g., an arithmetic median value, among others) to determine the alignment value 345.

Further, each of the beacon path circuitries 1010 is associated with a different delay 830 (e.g., propagation time) of an associated data path circuitry. For example with reference to FIG. 3, the delay circuitry $830_1$ of the beacon path circuitry $1010_1$ is associated with the delay of the data path 350. Further, the delay of the delay circuitry $830_N$ and the delay circuitry $832_N$ of is associated with the delay of the data path 352. With reference to FIG. 7, the delay of the delay circuitry $830_1$ and the delay circuitry $830_N$ is associated with the delay of the data path segment 740 and the beacon path 750, a delay $830_2$ is associated with the delay of the data path segment 742 and the beacon path 752, a delay $830_3$ is associated with the delay of the data path segment 744 and the beacon path 754, and a delay $830_4$ is associated with the delay of the data path segment 746 and the beacon path 756. Further, each delay circuitry 830 may differ from each other.

While each beacon generator circuitry 810 is illustrated as being driven by the same clock signal 801, in other examples, one or more of the beacon generator circuities 810 is driven by a different clock signal. Further in one example, each beacon generator circuitry 810 is driven by a different clock signal.

In one example, based on a determination that the clock signal 802 with the clock signal 801 are aligned (e.g., rising edges are aligned), the phase of the clock signal 802 is shifted by 180 degrees. In one example, 180 degrees is determined based on a code value. For example, for 256 codes, the phase shift of 180 degrees is determined by rotating 128 codes from the rising edge aligned location. Shifting the clock signal 802 by 180 degrees ensures that data is obtained by receive block circuitry (e.g., receive block circuitry 330 of FIG. 3) after a corresponding data signal is output from the interface circuitry (e.g., interface circuitry 310 of FIG. 3) and passed through and/or processed by processing circuitry (e.g., the processing circuitry 320 of FIG. 3).

Figure 11:
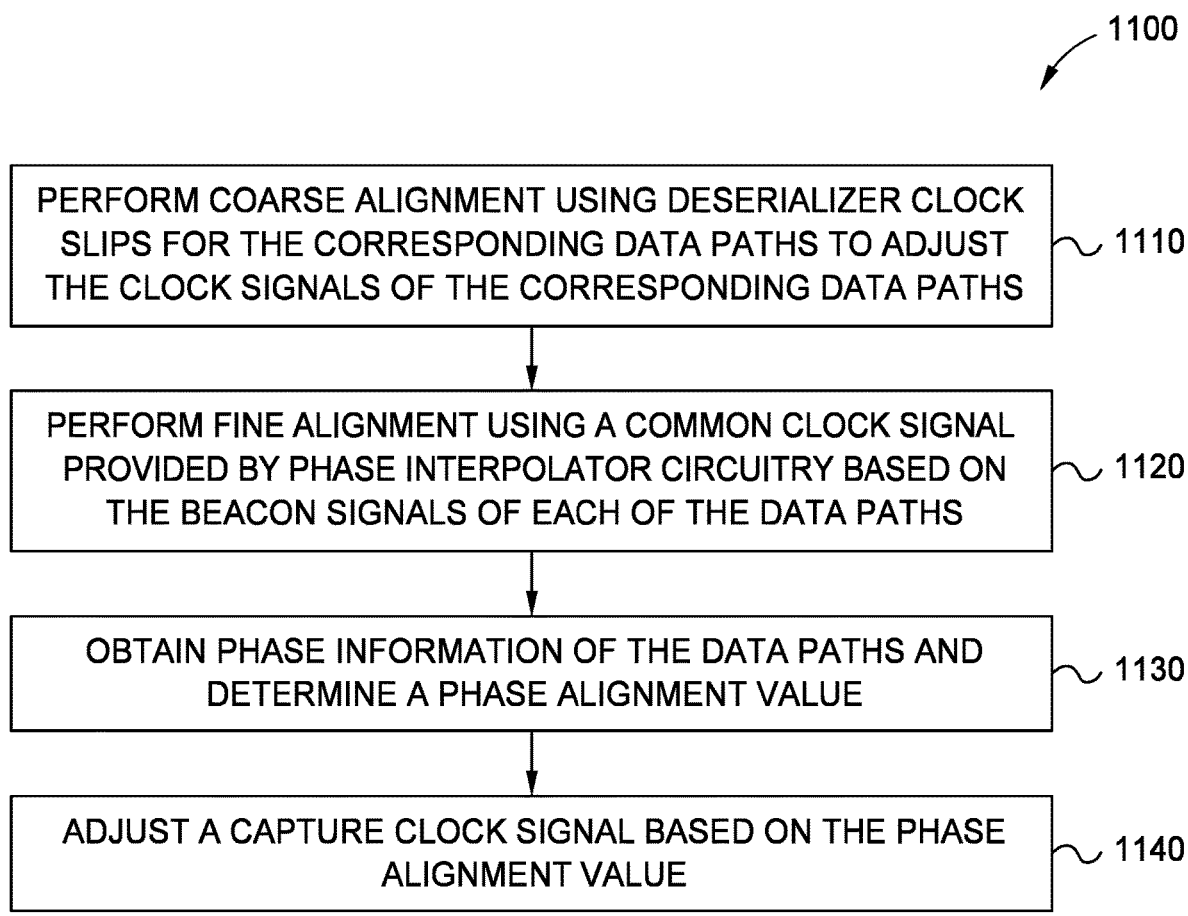
FIG. 11 illustrates a flowchart of a method for aligning a capture clock signal with a launch clock signal.

FIG. 11 illustrates a flowchart of a method 1100 for mitigating phase alignment errors between a capture clock signals and a launch clock signal. The method 1100 is performed by the phase alignment circuitry 340 of FIG. 3. At 1110 of the method 1100, coarse alignment is performed using the de-serializer clock slips for the corresponding data paths to adjust the clock signals of the corresponding data paths. In one example, the deserializer circuitries 510 and 512 of FIG. 5 are adjusted by applying a coarse phase adjustment to the clock signals. One more deserializer clock slip signals are used to apply a phase adjustment to the deserializer circuitries. Based on a request to perform clock slip, the output signal 823 of each beacon path circuitry 1010 is sampled to determine the all zero value (or all one value) zones (e.g., a zone where all output signals 823 have the same value). The clock slip procedure is continued until a non all zero (or all one) zone is detected. The deserializer circuits are adjusted, adjusting the phase relationship between the selected clock signals 307 (e.g., one of the clock signals 303 and 304) and 341 until all of the output signals of the beacon path circuitries 346 have the same value (e.g., a zero or one). In one example, an error is indicated based on two full recover clock signals (e.g., clock signals 208a and 208b of FIG. 2) occurring. In one example, performing the clock slip process decreases the amount of processing time used to align the capture and launch clock signals. For example with reference to FIG. 5, the deserializer circuitries 510 and 512 simultaneously begin performing clock slipping individually based on a clock slip request signal. In one example, the clock slip request signal is based on the output of the beacon path circuitries 346a and 346b. The output of the beacon path circuitries 346a and 346b is sampled to determine all zero values (all one zone values). The clock slip process is performed until all the output of the beacon path circuitries 346a and 346b is sampled to determine all one values (or non-zero values).

At 1120 of the method 1100, fine alignment is performed using a common clock signal provided by the phase interpolator circuitry based on the beacon signals of each of the data paths. For example, with reference to FIG. 3, the output of each beacon path circuitry 346a and 346b is received by the phase adjustment control circuitry, and is used to adjust the capture clock signal 341 output by the phase interpolator circuitry 342. With reference to FIG. 10, the beacon path circuitry 1010$_1$ generates the signal (the received beacon signal) 817$_1$ and the signal (local beacon signal) 819$_1$. The received beacon signal is compared to the local beacon signal to determine an adjustment value. In one example, comparing the received beacon signal with the local beacon signal includes performing XOR operation on the received beacon signal and the local beacon signal. In other examples, other logical operations may be used to compare the received beacon signal with the local beacon signal. With reference to FIG. 10, the comparison circuitry 822$_1$ compares the beacon signal 817$_1$ with the signal 819$_1$ to generate the output signal 823$_1$.

The adjustment value corresponds to whether or not the received beacon signal is aligned with the local beacon signal. For example, when the received beacon signal is aligned with the local beacon signal, the adjustment value has a value of zero, and when the received beacon signal and the local beacon signal are unaligned, the adjustment value has a value of one. In one example, at the beginning of the alignment process, the value of the beacon signal is zero or one, which can be set based on parity bit. A transition from zero to one or one to zero is detected, which indicates an edge has occurred. Once the edge is detected, the clock signal is maintained around that region.

In one example, the fine alignment process includes aligning a negative edge of the common clock signal with when a data signal is received. For example, the phase of the capture clock signal 341 of FIG. 3 is shifted (adjusted) until a negative edge of the capture clock signal 341 when the data signal 313 is received by the flip-flop 332. The corresponding code (or adjustment value) applied to the phase interpolator circuitry 342 is stored. Further, the capture clock signal 341 is shifted until a negative edge of the capture clock signal 341 is aligned with the data signal 323 being received by the flip-flop 334. The corresponding code (e.g., adjustment value) applied to the phase interpolator circuitry 342 is stored.

In one example, the phase alignment control circuitry 344 shifts the phase interpolator circuitry 342 through the corresponding code values until the adjustment value has a value of 0. For example, the phase interpolator circuitry 342 has an adjustment range of 256 codes (e.g., 0-255). In such an example, the phase alignment control circuitry 344 shifts the phase interpolator circuitry 342 through the code range starting at 0 and until the adjustment value has a value of 0. The code value associated with the adjustment value having a value of zero is stored and associated with the selected beacon path circuitry and/or data path. This process is completed for each beacon path circuitry 346, to determine multiple adjustment values and codes.

At 1130 of the method 1100, phase information of the data paths is obtained, and a phase alignment value is determined. The code value and/or alignment value associated with each data path is obtained. In one example, the code value associated with each of beacon path circuitry 346 is obtained and combined to determine a phase alignment value. In one example, the phase alignment control circuitry 344 averages the code values associated with each of the beacon path circuitries 346 to determine the alignment value. For example, arithmetic average or an arithmetic mean is determine from the code values to determine the alignment value.

At 1140, a capture clock signal is adjusted based on the phase alignment value. For example, with reference to FIG. 5, the phase of the phase interpolator circuitry 342 receives the alignment value 345, and adjust the phase the phase interpolator circuitry 342, adjusting the phase of the capture clock signal 341. In one example, the phase alignment value is an optimal value with regard to the corresponding data paths.

Figure 12:
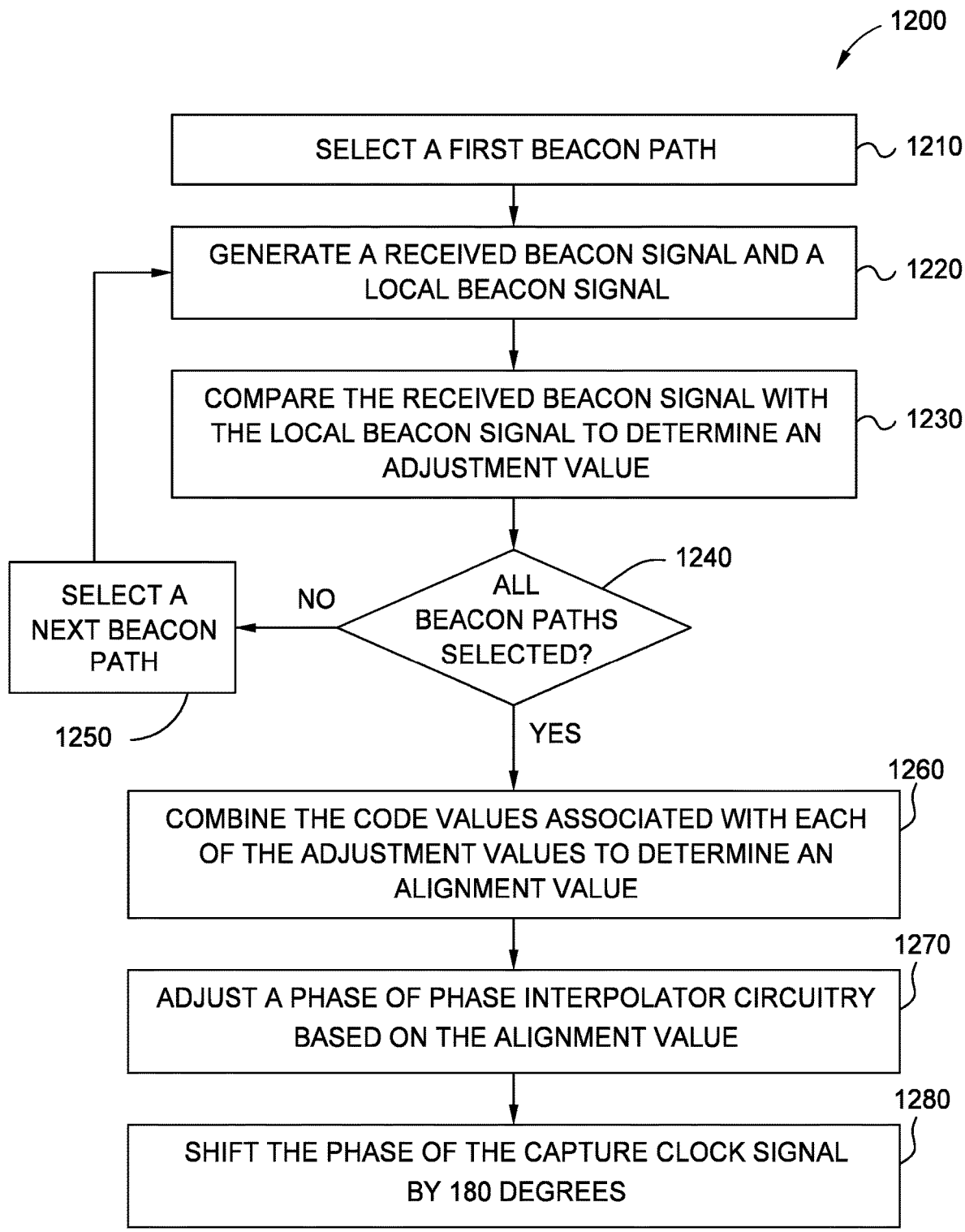
FIG. 12 illustrates a flowchart of a method for aligning a capture clock signal with a launch clock signal.

FIG. 12 illustrates a flowchart of a method 1200 to mitigate phase alignment effects on received data. The method 1200 is performed by the phase alignment circuitry 340 of FIG. 3. At 1210 of the method 1200, a first beacon path is selected. For example, with reference to FIG. 9, the beacon path circuitry 1010 is selected by driving the beacon path circuitry 1010$_1$ with the clock signal 802 (e.g., the capture clock signal). In one example, selection circuitry is used to select the beacon path circuitry 1010: by selectively driving the beacon path circuitry 1010$_1$ with the clock signal 802. In one example, the phase alignment control circuitry 344 determines which of the beacon path circuitries 1010 is selected.

In one example, before 1210 of the method 1200 is performed, the deserializer circuitries (e.g., the deserializer circuitries 510 and 512 of FIG. 5) are adjusted to apply a coarse phase adjustment to the clock signals. In one example, one more deserializer clock slip circuitries are used by applying a coarse a phase adjustment to the deserializer circuitries. Based on a request to perform clock slip, the output signal 823 of each beacon path circuitry 1010 is sampled to determine the all zero value (or all one value) zones (e.g., a zone where all output signals 823 have the same value). The clock slip procedure is continued until a non all zero, or all one zone, is detected. The deserializer circuits are adjusted, adjusting the phase relationship between the clock signals 801 and 802 until all of the output signals 823 have the same value (a zero or one). In one example, an error is indicated based on two full recover clock signals (e.g., clock signals 208a and 208b of FIG. 2) occur. After the clock slipping procedure is performed on each deserializer, the phase alignment circuitry is used to fine tune the phase of the clock signal.

At 1220 of the method 1200, a received beacon signal and a local beacon signal are generated. For example, with reference to FIG. 10, the beacon path circuitry 1010: generates the signal (the received beacon signal) 817, and the signal (local beacon signal) $819_1$.

At 1230 of the method 1200, the received beacon signal is compared to the local beacon signal to determine an adjustment value. In one example, comparing the received beacon signal with the local beacon signal includes performing XOR operation on the received beacon signal and the local beacon signal. In other examples, other logical operations may be used to compare the received beacon signal with the local beacon signal. With reference to FIG. 10, the comparison circuitry $822_1$ compares the beacon signal $817_1$ with the signal $819_1$ to generate the output signal $823_1$.

The adjustment value corresponds to whether or not the received beacon signal is aligned with the local beacon signal. For example, when the received beacon signal is aligned with the local beacon signal, the adjustment value has a value of zero, and when the received beacon signal and the local beacon signal are unaligned, the adjustment value has a value of one. In one example, at the beginning of the alignment process, the value of the beacon signal is 0 or 1, which can be set based on parity bit. A transition from 0 to 1 or 1 to 0 is detected, which indicates an edge has occurred. Once the edge is detected, the clock signal is maintained around that region.

In one example, the phase alignment control circuitry 344 shifts the phase interpolator circuitry 342 through the corresponding code values until the adjustment value has a value of 0. For example, the phase interpolator circuitry 342 has an adjustment range of 256 codes (e.g., 0-255). In such an example, the phase alignment control circuitry 344 shifts the phase interpolator circuitry 342 through the code range starting at 0 and until the adjustment value has a value of 0. The code value associated with the adjustment value having a value of 0 is stored and associated with the selected beacon path circuitry.

In one example, the code range is expanded beyond the code values of the phase interpolator circuitry 342. The code values of the phase interpolator circuitry 342 are circular, for 256 codes, the code range repeats back to a value of 0 after value 255. However, to allow for code shifts that are out of range, the base of the code values are expended. For example, bits may be added to the most significant bits of the code values, to all for code adjustments that are less than 0 degrees and greater than 360 degrees. In one example, 3 bits are added. Adding the 3 bits to the most significant bits (MSB) "100" expands the code range (e.g., to 0 to 2047 from 0 to 256), providing three more complete rotations in both directions. In the expanded code range, a virtual code value is generated for each code value by mapping the code value to the expanded code range. In one example, a first virtual code value is determined based on {3'b100, CODE1}, and each subsequent code value is determined by incrementing or decrementing from the first virtual code value.

At 1240 of the method 1200, a determination as to whether or not all beacon paths have been selected is made. For example, with reference to FIG. 10, the phase alignment control circuitry 344 determines if all of the beacon path circuitries 1010 have been selected. Based on a determination that one or more beacon paths have not been selected, the next beacon path is selected at 1250 of the method 1200, and 1220-1240 of the method 1240 are repeated until all beacon paths have been selected.

Based on a determination that all of the beacon paths have been selected at 1240 of the method 1200, the code values associated with each of the adjustment values are combined to determine an alignment value at 1260 of the method 1200. In one example, the phase alignment control circuitry 344 averages the code values associated with each of the beacon paths to determine an alignment value. For example, an arithmetic averaged is performed to determine the alignment value.

In an example where an expanded code base is used, the virtual codes are arithmetic averaged (or an arithmetic median is determined)) to determine the alignment value, and the alignment value is converted back to the original code base.

At 1270 of the method 1200, the phase of the phase interpolator circuitry is adjusted based on the alignment value. For example, with reference to FIG. 10, the phase of the phase interpolator circuitry 342 receives the alignment value 345, and adjust the phase the phase interpolator circuitry 342, adjusting the phase of the clock signal 802.

At 1280 of the method 1200, the phase of the capture clock signal is shifted by 180 degrees. In one example, the phase alignment control circuitry 344 of FIG. 10 instructs the phase interpolator circuitry 342 to shift the phase of the clock signal 802 by 180 degrees.

While the foregoing is directed to specific examples, other and further examples may be devised without departing from the basic scope thereof, and the scope thereof is determined by the claims that follow.

What is claimed is:

1. A receiver circuitry comprising:
   first data path circuitry configured to receive a first data signal based on a capture clock signal, the first data signal output based on a first launch clock signal;
   second data path circuitry configured to receive a second data signal based on the capture clock signal, the second data signal output based on a second launch clock signal; and
   phase alignment circuitry configured to:
      adjust a phase of the first launch clock signal and a phase of the second launch clock signal based on a first clock slip signal and a second clock slip signal, respectively; and
      adjust a phase of the capture clock signal relative to one of the first launch clock signal and the second launch clock signal based on a first adjustment value associated with the first data path circuitry and a second adjustment value associated with the second data path circuitry.

2. The receiver circuitry of claim 1, wherein the phase alignment circuitry is further configured to:
   generate the first adjustment value based on a first delay associated with the first data path circuitry; and

17 generate the second adjustment value based on a second delay associated with the second data path circuitry.

3. The receiver circuitry of claim 1, wherein the phase alignment circuitry is further configured to generate an alignment value based on the first adjustment value and the second adjustment value, and wherein the phase of the capture clock signal is adjusted based on the alignment value.

4. The receiver circuitry of claim 3, wherein adjusting the phase of the capture clock signal further comprises shifting the phase of the capture clock signal by 180 degrees.

5. The receiver circuitry of claim 1, wherein the first adjustment value is generated during a first period, and the second adjustment value is generated during a second period, and wherein the first period and the second period are non-overlapping.

6. The receiver circuitry of claim 1, wherein the first adjustment value associated with the first data path circuitry is determined by aligning a negative edge of the capture clock signal with an arrival time of the first data signal.

7. The receiver circuitry of claim 1, wherein the phase alignment circuitry comprises:
first beacon path circuitry configured to:
compare a first received beacon signal with a first local beacon signal, wherein the first received beacon signal is delayed based on a first delay of the first data path circuitry; and
output a first output signal based on the comparison of the first received beacon signal with the first local beacon signal; and
phase alignment control circuitry configured to generate the first adjustment value based on the first output signal.

8. A phase alignment circuitry configured to:
adjust a phase of a first launch clock signal based on a first clock slip signal and a phase of a second launch clock signal based on a second clock slip signal, wherein a first data signal is output based on the first launch clock signal and a second data signal is output based on the second launch clock signal; and
adjust a phase of a capture clock signal relative to one of the first launch clock signal and the second launch clock signal based on a first adjustment value and a second adjustment value, wherein the first adjustment value is associated with a first data path and the second adjustment value is associated with a second data path.

9. The phase alignment circuitry of claim 8 further configured to:
generate the first adjustment value based on a first delay associated with the first data path; and
generate the second adjustment value based on a second delay associated with the second data path.

10. The phase alignment circuitry of claim 8 further configured to generate an alignment value based on the first adjustment value and the second adjustment value, and wherein the phase of the capture clock signal is adjusted based on the alignment value.

11. The phase alignment circuitry of claim 10, wherein adjusting the phase of the capture clock signal further comprises shifting the phase of the capture clock signal by 180 degrees.

12. The phase alignment circuitry of claim 8, wherein the first adjustment value is generated during a first period, and the second adjustment value is generated during a second period, and wherein the first period and the second period are non-overlapping.

18

13. The phase alignment circuitry of claim 8, wherein the first adjustment value associated with the first data path is determined by aligning a negative edge of the capture clock signal with an arrival time of the first data signal.

14. The phase alignment circuitry of claim 8 comprising:
first beacon path circuitry configured to:
compare a first received beacon signal with a first local beacon signal, wherein the first received beacon signal is delayed based on a first delay of the first data path; and
output a first output signal based on the comparison of the first received beacon signal with the first local beacon signal; and
phase alignment control circuitry configured to generate the first adjustment value based on the first output signal.

15. A method comprising:
adjusting a phase of a first launch clock signal based on a first clock slip signal and a phase of a second launch clock signal based on a second clock slip signal, wherein a first data signal is output based on the first launch clock signal and a second data signal is output based on the second launch clock signal; and
adjusting a phase of a capture clock signal relative to one of the first launch clock signal and the second launch clock signal based on a first adjustment value and a second adjustment value, wherein the first adjustment value is associated with a first data path and the second adjustment value is associated with a second data path.

16. The method of claim 15 further comprising:
generating the first adjustment value based on a first delay associated with the first data path; and
generating the second adjustment value based on a second delay associated with the second data path.

17. The method of claim 15 further comprising generating an alignment value based on the first adjustment value and the second adjustment value, and wherein the phase of the capture clock signal is adjusted based on the alignment value.

18. The method of claim 15, wherein adjusting the phase of the capture clock signal further comprises shifting the phase of the capture clock signal by 180 degrees.

19. The method claim 15, wherein the first adjustment value associated with the first data path is determined by aligning a negative edge of the capture clock signal with an arrival time of the first data signal.

20. The method of claim 15 further comprising:
comparing a first received beacon signal with a first local beacon signal, wherein the first received beacon signal is delayed based on a first delay of the first data path; and
outputting a first output signal based on the comparison of the first received beacon signal with the first local beacon signal;
comparing a second received beacon signal with a second local beacon signal;
outputting a second output signal based on the comparison of the second received beacon signal with the second local beacon signal; and
generating the first adjustment value based on the first output signal, and generating the second adjustment value based on the second output signal.

* * * * *